US007459973B2

(12) United States Patent
Kouki et al.

(10) Patent No.: US 7,459,973 B2
(45) Date of Patent: Dec. 2, 2008

(54) METHOD AND APPARATUS FOR AMPLIFYING A SIGNAL MODULATED IN AMPLITUDE

(75) Inventors: Ammar B. Kouki, Montréal (CA); Gwënael Poitau, Montréal (CA)

(73) Assignee: École De Technologie Supérieure, Montréal (CA)

(*) Notice: Subject to any disclaimer, the term of this patent is extended or adjusted under 35 U.S.C. 154(b) by 86 days.

(21) Appl. No.: 11/450,410

(22) Filed: Jun. 12, 2006

(65) Prior Publication Data

US 2007/0285161 A1 Dec. 13, 2007

(51) Int. Cl.
*H03F 3/68* (2006.01)

(52) U.S. Cl. .................................. 330/124 R; 330/136

(58) Field of Classification Search ............ 330/124 R, 330/136

See application file for complete search history.

(56) References Cited

U.S. PATENT DOCUMENTS 3,777,275 A 12/1973 Cox
5,929,702 A 7/1999 Myers et al.
6,285,251 B1 9/2001 Dent et al.
6,567,653 B1 5/2003 Sanders
6,600,369 B2 7/2003 Mitzlaff
6,633,200 B2 10/2003 Kolanek
6,690,233 B2 2/2004 Sander
6,816,008 B2 11/2004 Kontson
6,825,719 B1 11/2004 Barak et al.
6,853,244 B2 * 2/2005 Robinson et al. .............. 330/51
2002/0187764 A1 12/2002 Constantinidis
2004/0263242 A1 12/2004 Hallberg

FOREIGN PATENT DOCUMENTS

WO WO 0239577 5/2002

* cited by examiner

*Primary Examiner*—Steven J Mottola
(74) *Attorney, Agent, or Firm*—Ogilvy Renault LLP

(57) ABSTRACT

A method and apparatus for amplifying a signal modulated in amplitude using amplifiers having a given dynamic range corresponding to a limited conduction angle, comprising separating the signal in a first signal and in a second signal depending on the dynamic range of the amplifiers, wherein each of the first signal and the second signal has a corresponding phase assigned based on an amplitude of the signal, amplifying each of the first signal and the second signal using the amplifiers and combining the amplified signals.

10 Claims, 6 Drawing Sheets

METHOD AND APPARATUS FOR AMPLIFYING A SIGNAL MODULATED IN AMPLITUDE

FIELD OF THE INVENTION

The invention relates to field of electronics. More precisely, the invention pertains to a method for amplifying a signal modulated in amplitude using amplifiers having a given dynamic range.

BACKGROUND OF THE ART

Now referring to FIG. 1, there is shown a prior art embodiment of a Linear Amplification with non-Linear Components (LINC)-based apparatus 8 for amplifying a signal.

The apparatus 8 comprises a low pass filter 12, a LINC-based signal separator unit 14, a first RF conversion unit 16, a first power amplifier 18, a second RF conversion unit 20, a second power amplifier 22 and a combiner 24.

The skilled addressee will appreciate that the apparatus 8 is used to amplify a signal provided by the data generation unit 10.

The low pass filter 12 is used to perform a low pass filtering of the signal provided by the data generation unit 10.

The LINC-based separator 14 is used to receive the low pass filtered signal S(t) provided by the low pass filter 12 and to separate the signal into a first signal $S_1(t)$ and a second signal $S_2(t)$.

The skilled addressee will appreciate that the low pass filtered signal S(t) may be represented as $S(t)=r(t)e^{j\Phi(t)}, 0 \leqq r(t) \leqq r_{MAX}$.

The skilled addressee will further appreciate that according to a LINC-based decomposition, $$S_1(t) = \frac{1}{2}S(t) + e_1(t)$$

and $$S_2(t) = \frac{1}{2}S(t) + e_2(t)$$

with $$e_1(t) - e_2(t) = j\frac{s(t)}{2}\sqrt{\frac{r_{MAX}^2}{r^2(t)} - 1}.$$

The first signal $S_1(t)$ is provided to the first RF conversion unit 16 while the second signal $S_2(t)$ is provided to the second RF conversion unit 20. The first RF conversion unit 16 performs a RF conversion of the first signal $S_1(t)$ and provides a first RF converted signal to the first power amplifier 18 while the second RF conversion unit 20 receives the second signal $S_2(t)$ and provides a corresponding second RF converted signal to the second power amplifier 22.

The first power amplifier 18 performs a power amplification of the first RF converted signal provided while the second power amplifier 22 performs a conversion of the second RF converted signal. The combiner 24 receives the first amplified signal and the second amplified signal and combines those signals to provide a combined signal.

The skilled addressee will appreciate that the order of low pass filtering and signal separation may be reversed such that signal separation is carried out in the digital domain and the two separated signals $S_1(t)$ and $S_2(t)$ are low pass filtered.

Referring to FIG. 2, there is shown a complex representation of the first signal $S_1(t)$, the second signal $S_2(t)$ and the low pass filtered signal S(t).

While both the first power amplifier 18 and the second power amplifier 22 operate at a maximum efficiency, since their signals have no amplitude variation, the summation in the combiner 24 dissipates the excess energy (i.e. when two signals are out of phase, the combiner 24 performs a subtraction and dissipates the subtracted energy which reduces the overall efficiency). Dissipation in heat therefore occurs. The more out of phase the signals are, the more the instantaneous efficiency decreases. The skilled addressee will further appreciate that the decrease is higher for signals having larger amplitude variations which is a drawback.

The skilled addressee will appreciate that for $r(t)=r_{MAX}$, the two signals are in-phase and the efficiency is maximal.

Features of the invention will be apparent from review of the disclosure, drawings and description of the invention below.

DISCLOSURE OF THE INVENTION

The invention provides a method for amplifying a signal S(t) modulated in amplitude using amplifiers having a given dynamic range ($S_{MIN}$, $S_{MAX}$), comprising separating the signal S(t) in a first signal $S_1(t)$ and in a second signal $S_2(t)$ depending on the dynamic range ($S_{MIN}$, $S_{MAX}$) of the amplifiers, wherein each of the first signal $S_1(t)$ and the second signal $S_2(t)$ has a corresponding phase assigned based on an amplitude of the signal S(t), amplifying each of the first signal $S_1(t)$ and the second signal $S_2(t)$ using the amplifiers and combining the amplified signals.

According to one aspect of the invention, there is provided an apparatus for amplifying a signal S(t) modulated in amplitude, the apparatus comprising a pair of amplifiers having a dynamic range ($S_{MIN}$, $S_{MAX}$), each receiving a signal to amplify and providing a corresponding amplified signal and a flexible signal component separator unit for receiving the signal S(t) and for providing a first signal $S_1(t)$ and in a second signal $S_2(t)$ to a corresponding one of the amplifiers depending on the dynamic range ($S_{MIN}$, $S_{MAX}$) of the amplifiers, wherein each of the first signal $S_1(t)$ and the second signal $S_2(t)$ has a corresponding phase assigned based on an amplitude of the signal S(t).

In this specification, LINC is intended to mean Linear Amplification with Non-Linear Components.

DESCRIPTION OF THE DRAWINGS

In order that the invention may be readily understood, embodiments of the invention are illustrated by way of example in the accompanying drawings.

Further details of the invention and its advantages will be apparent from the detailed description included below.

DETAILED DESCRIPTION OF PREFERRED EMBODIMENTS

In the following description of the embodiments, reference to the accompanying drawings are by way of illustration of an example by which the invention may be practiced. It will be understood that other embodiments may be made without departing from the scope of the invention disclosed.

Figure 1:
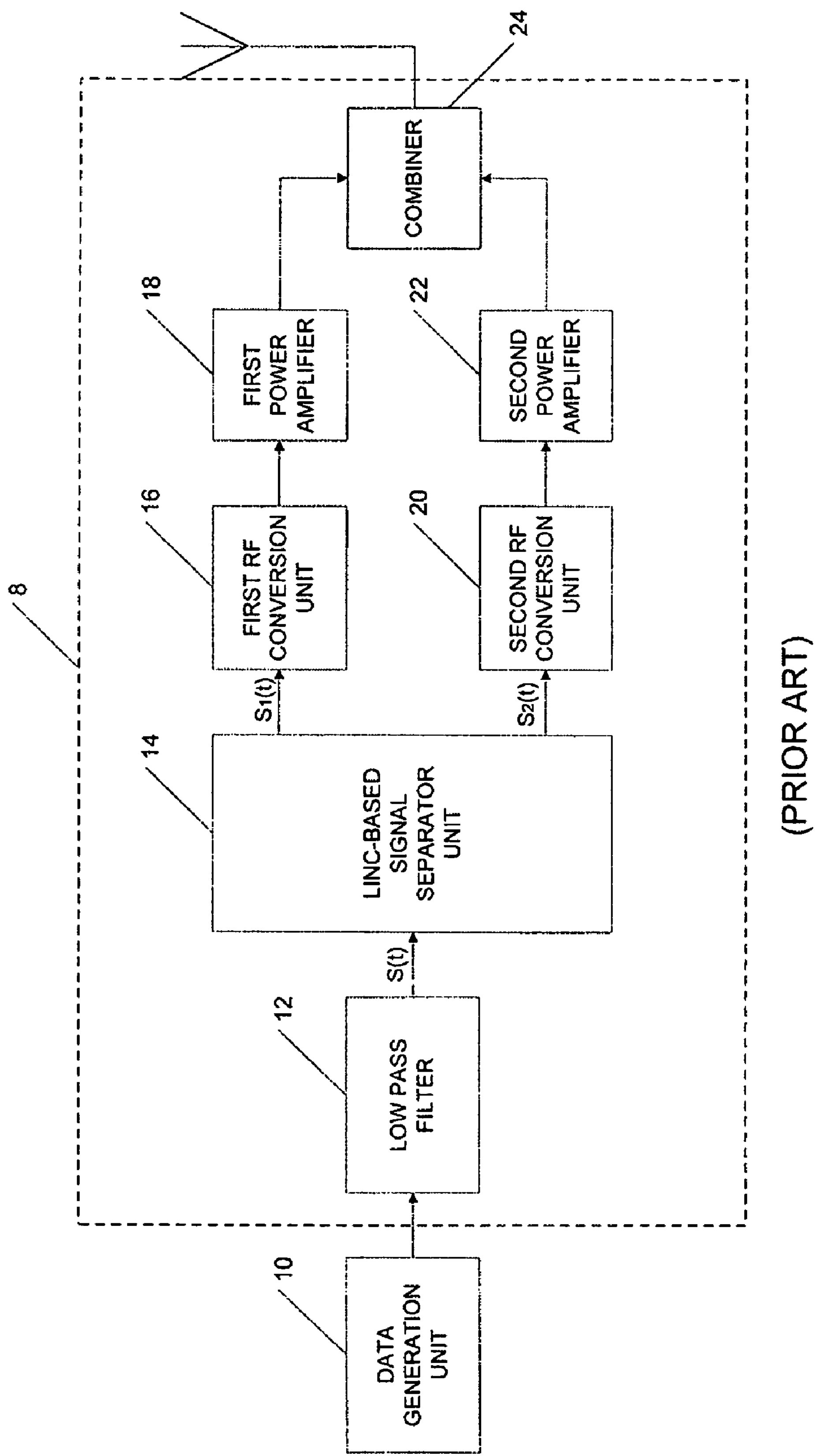
FIG. 1 is a block diagram showing a prior art apparatus for amplifying a signal using two power amplifiers; the apparatus operates according to a Linear Amplification with Non-Linear Components (LINC) method.
Figure 2:
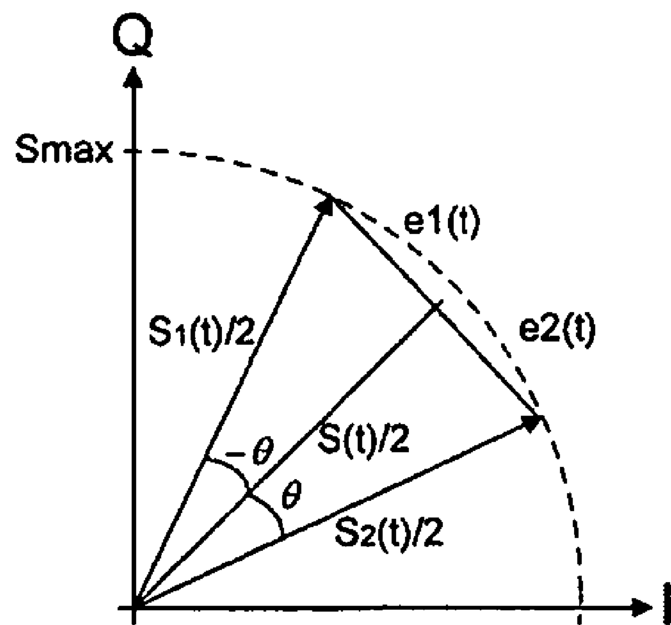
FIG. 2 is a diagram showing a complex representation of signals generated using an implementation of a Linear Amplification with Non-Linear Components (LINC)
Figure 3:
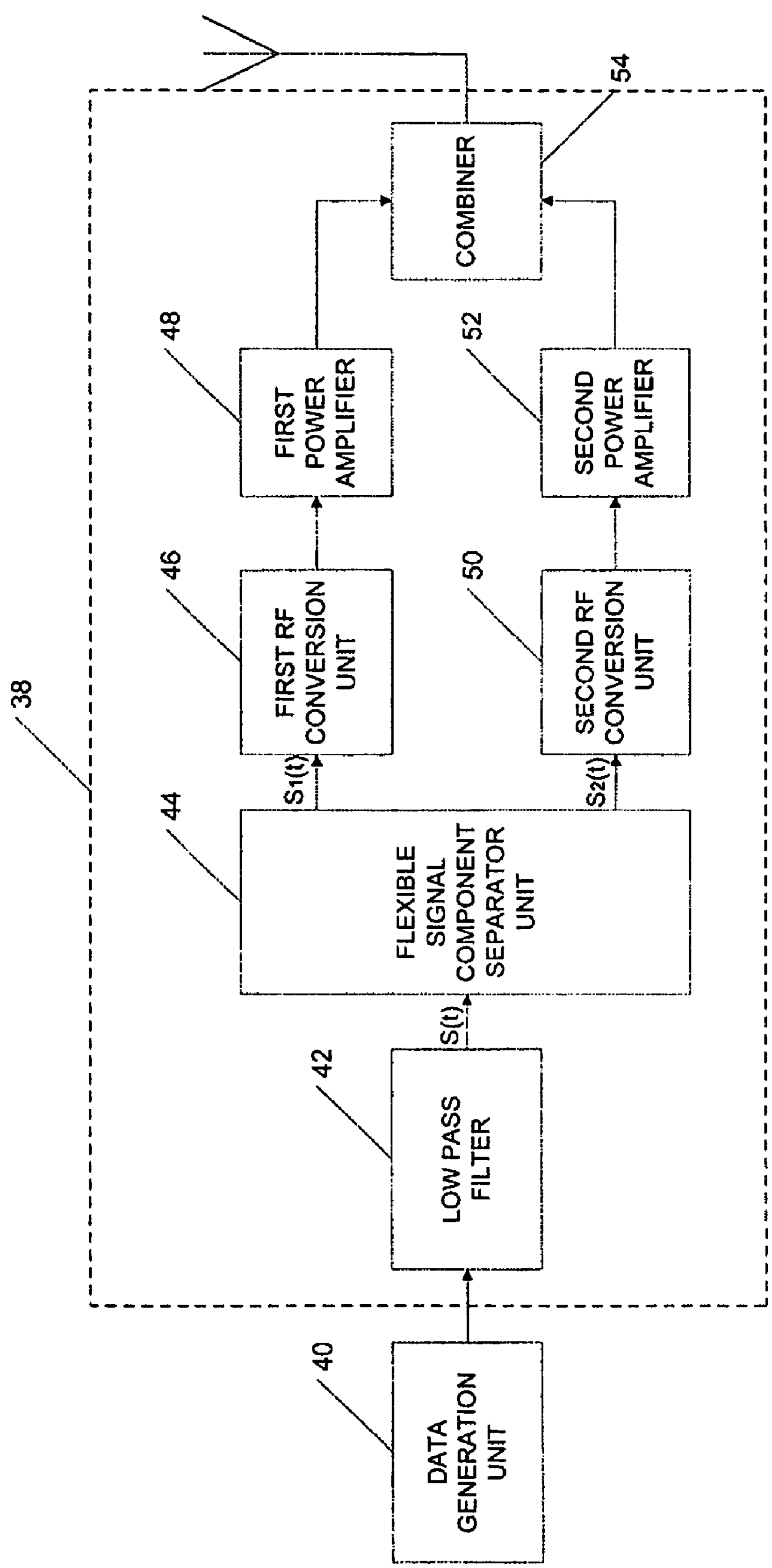
FIG. 3 is a block diagram showing an embodiment of an apparatus for amplifying a signal using two power amplifiers; the apparatus comprises a flexible signal component separator and limited-dynamic range amplifiers.

Now referring to FIG. 3, there is shown an embodiment of an apparatus 38 for amplifying a signal using two power amplifiers according to one embodiment of the invention.

The apparatus 38 comprises a low pass filter 42, a flexible signal component separator unit 44, a first RF conversion unit 46, a first power amplifier 48, a second RF conversion unit 50, a second power amplifier 52 and a combiner 54.

The low pass filter 42 receives a signal provided by the data generation unit 40 and which is intended to be amplified.

The low pass filter 42 provides a filtered signal S(t) to the flexible signal component separator unit 44. The flexible signal component separator unit 44 separates the filtered signal S(t) provided by the low pass filter 42 into a first signal $S_1(t)$ and a second signal $S_2(t)$ according to one embodiment of the invention.

The first RF conversion unit 46 receives the first separated signal $S_1(t)$ and provides a first RF converted signal to the first power amplifier 48. The second RF conversion unit 50 receives the second separated signal $S_2(t)$ and provides a corresponding second RF converted signal to the second power amplifier 52.

The first power amplifier 48 performs a power amplification of the first RF converted signal and provides a corresponding first power amplified signal to the combiner 54 while the second power amplifier 52 performs a power amplification of the second RF converted signal and provides a corresponding second power amplified signal.

The combiner 54 receives the first and the second power amplified signals and provides a combined signal to an antenna or any other output device.

Figure 4:
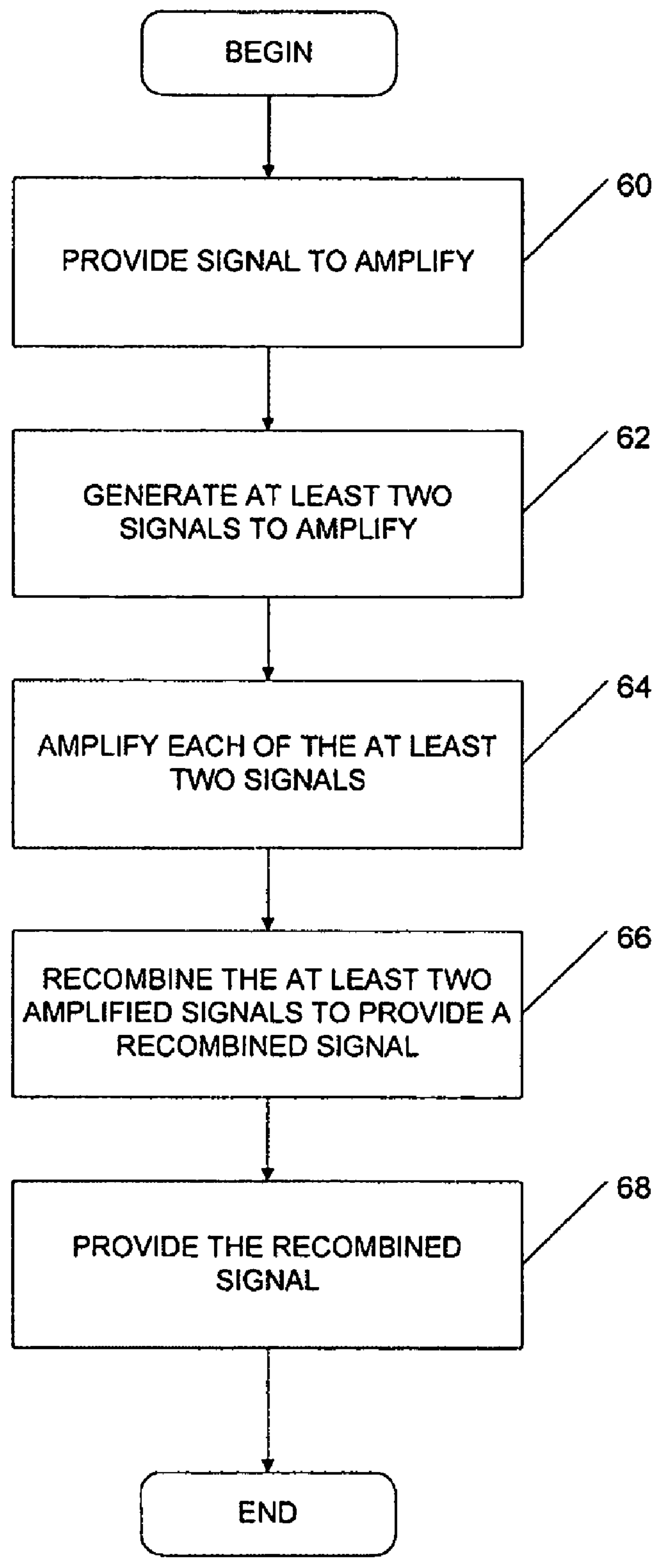
FIG. 4 is a flowchart showing how to amplify a signal according to one embodiment of the invention; according to a first step a signal to amplify is provided; according to a second step, at least two signals are generated; according to a third step the at least two generated signals are recombined and according to a fourth step, the recombined signals are provided.

Now referring to FIG. 4, there is shown how a signal is amplified according to one embodiment of the invention.

According to step 60, a signal to amplify S(t) is provided. The signal to amplify S(t) is provided by a data generation unit in one embodiment. It will be appreciated that the signal to amplify S(t) may be optionally filtered using a low pass filter as shown in FIG. 3. In one embodiment, the data generation unit comprises all necessary baseband signal processing, including modulation, coding, pulse shaping filtering, etc., as well as a digital to analog converter. In this form, the signal separation is to be carried out in the analog domain. Alternatively, the signal to amplify may be provided by a data generation unit that comprises all necessary baseband signal processing, including modulation, coding, pulse shaping filtering, etc., as well as a digital implementation of the flexible signal component separator unit followed by two digital to analog converters and two low pass filters.

According to step 62, at least two signals to amplify $S_1(t)$ and $S_2(t)$ are generated from the provided signal to amplify S(t). It will be appreciated that the at least two signals to amplify $S_1(t)$ and $S_2(t)$ are generated using a flexible signal component separator unit in accordance with one embodiment of the invention and as explained further below.

According to step 64, each of the at least two generated signals to amplify $S_1(t)$ and $S_2(t)$ are amplified. In one embodiment, the at least two generated signals to amplify $S_1(t)$ and $S_2(t)$ are amplified using an amplifier which has in one embodiment a dynamic operating zone $\Delta_{DYN}$ limited by a minimum signal value $S_{MIN}$ and a maximum signal value $S_{MAX}$. The amplifier bias need not be adjusted with varying signal levels but is set once in a manner that optimizes its conduction angle for the limited dynamic sought $\Delta_{DYN}$, e.g. and overdriven class B amplifier. Typically bias conditions in the range between class B and class C may be chosen to maintain high amplifier efficiency. The corresponding dynamic ranges in these cases depend on the conduction angles which will vary between 180 (class B) and 0 (class C) degrees.

According to step 66, each of the amplified signals is recombined together. In one embodiment, the amplified signals are recombined together using a resistive combiner such as a Wilkinson combiner or a hybrid coupler. In another embodiment, the combiner may be an outphasing-type lossless combiner such as a Chierex combiner.

According to step 68, the recombined signal generated by recombining each of the amplified signals is provided. It will be appreciated that the recombined signal may be provided to various units such as to an antenna for instance.

Figure 5:
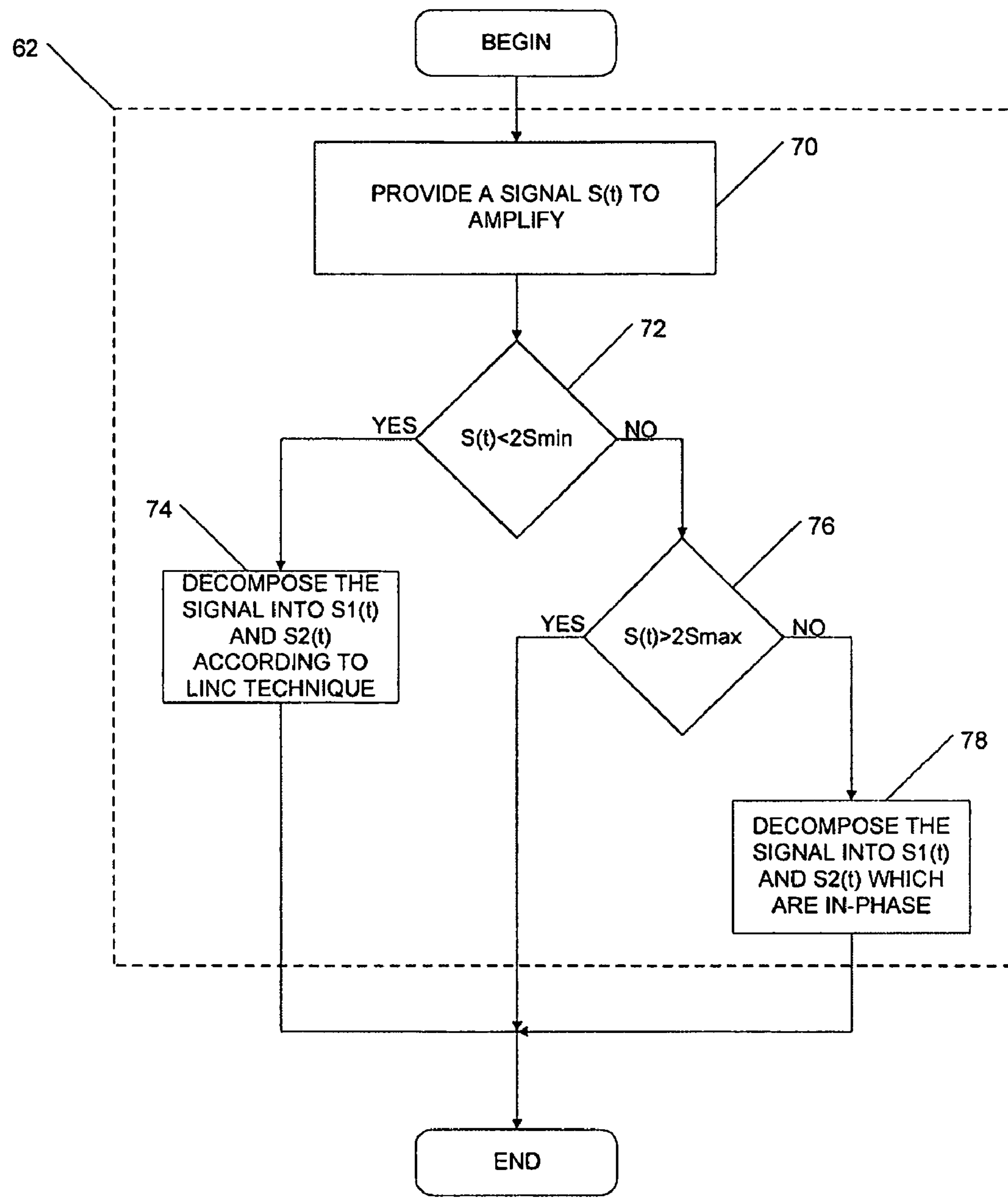
FIG. 5 is a flowchart showing how the at least two signals are generated according to one embodiment.

Now referring to FIG. 5, there is shown an embodiment for generating the at least two signals to amplify $S_1(t)$ and $S_2(t)$.

According to step 70, a signal S(t) to amplify is provided. According to step 72, a test is performed in order to find out if the signal to amplify S(t) is smaller than two times the minimum value $S_{MIN}$.

In the case where the signal to amplify S(t) is smaller than two times the minimum value $S_{MIN}$ and according to step 74, the signal S(t) is decomposed into $S_1(t)$ and $S_2(t)$ according to a prior art LINC technique.

Figure 6A:
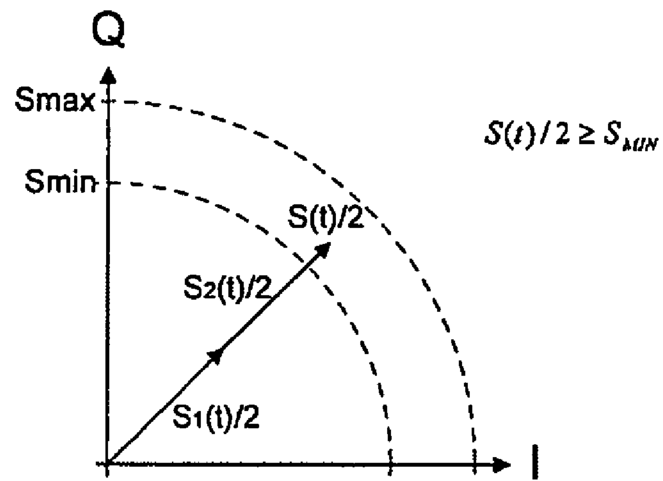
FIG. 6*a* is a diagram which shows a complex representation of a first generated signal and a second generated signal which are generated according to one embodiment of the invention in the case where $S(t)/2 \geqq S_{MIN}$.
Figure 6B:
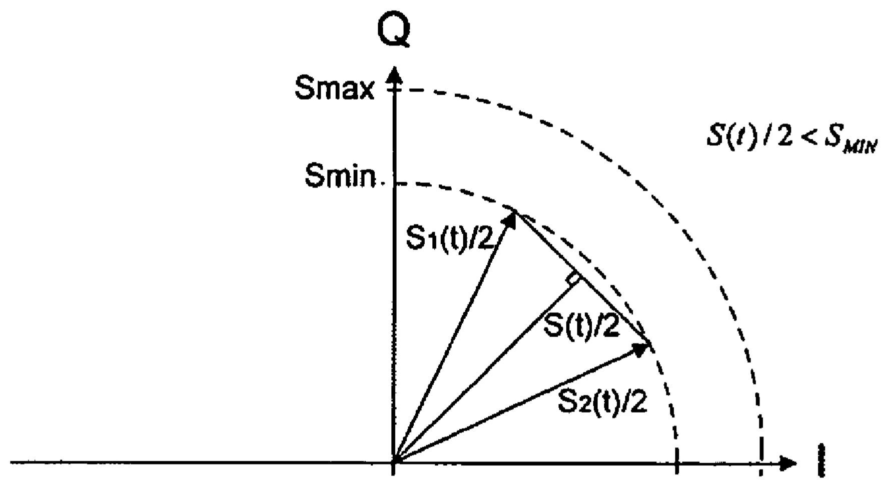
FIG. 6*b* is a diagram which shows a complex representation of a first generated signal and a second generated signal which are generated according to one embodiment of the invention in the case where $S(t)/2 < S_{MIN}$.

Now referring to FIG. 6*b*, there is shown a complex representation of $S_1(t)$ and $S_2(t)$ in the case where $S(t)/2 < S_{MIN}$.

Now referring back to FIG. 5 and in the case where the signal to amplify S(t) is not smaller than two times the minimum value $S_{MIN}$ and according to step 78, the signal S(t) is decomposed into a first signal $S_1(t)$ and a second signal $S_2(t)$ which are in-phase according to $S_1(t)=S_1(t)={}^{S(t)}/_2$.

Now referring to FIG. 6*a*, there is shown a complex representation of the first signal $S_1(t)$ and the second signal $S_2(t)$ in the case where $S(t)/2 \geqq S_{MIN}$.

The skilled addressee will appreciate that the signal dynamic range is extended to a certain limit which increases the combining efficiency and the linearity of the apparatus. The lower limit is computed in order to keep a sufficient gain. It has been contemplated that the better compromise between an amplifier conduction angle and an input signal's probability density function must be found in order to increase combining efficiency and linearity. Efficiency is maximum for in-phase components. According to the embodiment disclosed herein, the signal S(t) is therefore decomposed into two in-phase components when they are in the amplifier dynamic range. If this is not the case, a LINC decomposition is performed so that a lower limit of the amplified signal is ensured. The skilled addressee will appreciate that a limited-range predistortion may be used over the limited dynamic range of the amplifiers.

Although the above description relates to a specific preferred embodiment as presently contemplated by the inventors, it will be understood that the invention in its broad aspect includes mechanical and functional equivalents of the elements described herein.

We claim:

1. A method for amplifying a signal S(t) modulated in amplitude using amplifiers having a given dynamic range ($S_{MIN}$, $S_{MAX}$), comprising:

separating the signal S(t) in a first signal $S_1$(t) and in a second signal $S_2$(t) depending on the dynamic range ($S_{MIN}$, $S_{MAX}$) of the amplifiers, wherein each of the first signal $S_1$(t) and the second signal $S_2$(t) has a corresponding phase assigned based on an amplitude of said signal S(t);

amplifying each of the first signal $S_1$(t) and the second signal $S_2$(t) using the amplifiers; and combining the amplified signals.

2. The method as claimed in claim 1, wherein said separating comprises performing a test to find out if the signal S(t) is smaller than two times $S_{MIN}$ and further wherein said first signal $S_1$(t) and said second signal $S_2$(t) are generated in-phase if the signal S(t) is not smaller than two times $S_{MIN}$.

3. The method as claimed in claim 2, wherein said first signal $S_1$(t) and said second signal $S_2$(t) are generated according to a LINC technique if the signal S(t) is smaller than two times $S_{MIN}$.

4. The method as claimed in claim 1, wherein said amplifying comprises RF converting each of the first signal $S_1$(t) and the second signal $S_2$(t) using corresponding RF conversion units and further amplifying each of the RF converted signals using the amplifiers.

5. The method as claimed in claim 1, wherein said signal S(t) is further filtered using a low-pass filter.

6. An apparatus for amplifying a signal S(t) modulated in amplitude, said apparatus comprising:

a pair of amplifiers having a dynamic range ($S_{MIN}$, $S_{MAX}$), each receiving a signal to amplify and providing a corresponding amplified signal;

a flexible signal component separator unit for receiving said signal S(t) and for providing a first signal $S_1$(t) and in a second signal $S_2$(t) to a corresponding one of the amplifiers depending on the dynamic range ($S_{MIN}$, $S_{MAX}$) of the amplifiers, wherein each of the first signal $S_1$(t) and the second signal $S_2$(t) has a corresponding phase assigned based on an amplitude of said signal S(t); and a combiner for receiving and combining the corresponding amplified signals to provide a combined amplified signal.

7. The apparatus as claimed in claim 6, wherein said flexible signal component separator unit generates said first signal $S_1$(t) and said second signal $S_2$(t) in-phase if said signal S(t) is not smaller than two times $S_{MIN}$.

8. The apparatus as claimed in claim 7, wherein said first signal $S_1$(t) and said second signal $S_2$(t) are generated according to a LINC technique if the signal S(t) is smaller than two times $S_{MIN}$.

9. The apparatus as claimed in claim 6, further comprising a pair of RF conversion units each for providing a corresponding RF converted signal to a corresponding amplifier of said amplifiers.

10. The apparatus as claimed in claim 6, further comprising a low pass filter, further wherein said signal S(t) is received by said low pass filter and further wherein a low pass filtered signal is provided to said flexible signal component separator unit.

* * * * *